US009397632B2

(12) United States Patent
Tan et al.

(10) Patent No.: US 9,397,632 B2
(45) Date of Patent: Jul. 19, 2016

(54) FILTER

(71) Applicant: Huawei Technologies Co., Ltd., Shenzhen, Guangdong (CN)

(72) Inventors: Bin Tan, Shenzhen (CN); Ronghua Xie, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 122 days.

(21) Appl. No.: 14/313,696

(22) Filed: Jun. 24, 2014

(65) Prior Publication Data

US 2014/0312991 A1    Oct. 23, 2014

Related U.S. Application Data

(63) Continuation of application No. PCT/CN2013/073886, filed on Apr. 8, 2013.

(30) Foreign Application Priority Data

Jul. 30, 2012  (CN) .......................... 2012 1 0268285

(51) Int. Cl.
*H03H 7/01* (2006.01)
*H01G 4/30* (2006.01)
*H01G 4/012* (2006.01)
*H01G 4/232* (2006.01)
(Continued)

(52) U.S. Cl.
CPC ............. *H03H 7/0138* (2013.01); *H01G 4/012* (2013.01); *H01G 4/232* (2013.01); *H01G 4/30* (2013.01); *H01G 4/38* (2013.01); *H03H 7/427* (2013.01); *H03H 2001/0085* (2013.01)

(58) Field of Classification Search
CPC ................... H03H 2001/0085; H03H 7/0115; H03H 7/0138; H01G 4/30
USPC ................ 333/4, 5, 175, 185; 361/306.3, 328
See application file for complete search history.

(56) References Cited

U.S. PATENT DOCUMENTS 6,407,906 B1    6/2002    Ahiko et al.
6,603,646 B2    8/2003    Anthony et al.
(Continued)

FOREIGN PATENT DOCUMENTS

CN    100431067 C    11/2008
CN    102291100 A    12/2011
(Continued)

OTHER PUBLICATIONS

Steve Weir, et al., "Interference suppression using a balanced MLCC", Interference Technology, Jan. 1, 2007, 4 pages.

*Primary Examiner* — Robert Pascal
*Assistant Examiner* — Rakesh Patel (57) ABSTRACT

The present invention provides a filter. The filter includes two common electrode layers and two inner electrode layers, where the two inner electrode layers are located between the two common electrode layers, and an electrical insulation layer is disposed between any two adjacent electrode layers of the two common electrode layers and the two inner electrode layers; each of the two common electrode layers is connected to at least one grounding electrode; and each of the two inner electrode layers is connected to at least one signal electrode. The filter provided by embodiments of the present invention can perform filtering processing on low-frequency noise such as that of a direct current power supply, and has a good filtering processing effect.

12 Claims, 5 Drawing Sheets

(51) Int. Cl.
  *H01G 4/38* (2006.01)
  *H03H 1/00* (2006.01)
  *H03H 7/42* (2006.01)

(56) References Cited

U.S. PATENT DOCUMENTS

| | | |
|---|---|---|
| 7,423,860 B2 | 9/2008 | Anthony et al. |
| 2003/0102502 A1 | 6/2003 | Togashi |
| 2004/0070468 A1* | 4/2004 | Harada ............... H01P 1/20345 333/185 |
| 2005/0030126 A1 | 2/2005 | Inoue et al. |
| 2006/0028303 A1* | 2/2006 | Uchida ............... H01F 17/0013 333/185 |
| 2010/0207710 A1 | 8/2010 | Ziegler |
| 2011/0056735 A1 | 3/2011 | Lee et al. |
| 2011/0309895 A1 | 12/2011 | Ahn et al. |

FOREIGN PATENT DOCUMENTS

| | | |
|---|---|---|
| CN | 102790599 A | 11/2012 |
| KR | 2006-0008545 A | 1/2006 |
| WO | WO 00/74197 A1 | 12/2000 |

* cited by examiner

FILTER

CROSS-REFERENCE TO RELATED APPLICATIONS

This application is a continuation of International Application No. PCT/CN2013/073886, filed on Apr. 8, 2013, which claims priority to Chinese Patent Application No. 201210268285.8, filed on Jul. 30, 2012, both of which are hereby incorporated by reference in their entireties.

TECHNICAL FIELD

The present invention relates to a filter structure, and in particular, to a filter of a stacked structure.

BACKGROUND

A filter is a main component in an electronic device, which can filter various signals, so as to ensure operation stability and reliability of a circuit. In a filter circuit of a direct current power supply, a combinatorial circuit of a discrete X capacitor and a discrete Y capacitor is generally used as a filter to eliminate noise in a power supply circuit, such as clutter.

In the prior art, when filtering processing is performed for a direct current power supply, a discrete capacitor component is generally adopted. Specifically, an X capacitor is connected between a power cable and an earth return or between a power cable connected to a positive electrode and a power cable connected to a negative electrode, and is used to eliminate differential mode noise in a circuit. A microfarad-level thin film capacitor or a multilayer ceramic capacitor is generally used as the X capacitor. Meanwhile, a Y capacitor is connected between a power cable and a ground cable. Two capacitors are connected in series to serve as a Y capacitor, which then bridges the power cable and ground, and is used to eliminate common mode noise in a circuit. Because a phase of transmitted common mode noise is the same, connection symmetry of a Y type circuit is quite high, an earth leakage current is small, and a withstand voltage is relatively high. A Y capacitor generally uses a nanofarad-level ceramic capacitor. According to a function of a capacitor, the X capacitor which can eliminate differential mode noise may also be called a differential mode capacitor, and the Y capacitor which can eliminate common mode noise may be called a common mode capacitor. When a discrete capacitor component is used to connect a circuit, a large number of capacitor components are used and occupy large space. In addition, a high requirement is imposed on a location and accuracy of component disposition, and a filtering effect is relatively poor.

Therefore, in the prior art, a filter with a multi-layer structure is also put forward, which integrates a differential mode capacitor and a common mode capacitor, and includes two external common electrode layers and at least two inner electrode layers disposed between the two external common electrode layers. In addition, a common electrode layer is disposed between each two inner electrode layers, each electrode layer is connected to an external electrode disposed at an end of the filter, and an external circuit may connect to an inner electrode layer by using the external electrode. In this filter structure, a capacity of the formed differential mode capacitor is relatively small, and a differential mode filtering capability is relatively poor. Therefore, the filter structure can be used only in a high-frequency filter circuit, and cannot be applied to filtering of relatively low-frequency noise such as that of a direct current power supply.

To sum up, because a capacity of a differential mode capacitor is relatively small, an existing filter with a multi-layer structure cannot be applied to filtering processing of a direct current power supply such as that of low-frequency noise.

SUMMARY

Embodiments of the present invention provide a filter, which can improve a capacity of a differential mode capacitor, so that the filter can be applied to filtering processing on low-frequency noise such as that of a direct current power supply.

The embodiments of the present invention provide a filter, including two common electrode layers and two inner electrode layers, where the two inner electrode layers are located between the two common electrode layers, and an electrical insulation layer is disposed between any two adjacent electrode layers of the two common electrode layers and the two inner electrode layers; each of the two common electrode layers is connected to at least one grounding electrode; and each of the two inner electrode layers is connected to at least one signal electrode.

The present invention further provides a filter, including three common electrode layers and two pairs of inner electrode layers, where each pair of inner electrode layers includes two inner electrode layers.

the three common electrode layers include a first common electrode layer, a second common electrode layer and a third common electrode layer, where one pair of inner electrode layers is located between the first common electrode layer and the second common electrode layer, the other pair of inner electrode layers is located between the second common electrode layer and the third common electrode layer, and an electrical insulation layer is disposed between each two electrode layers; and each of the three common electrode layers is connected to at least one grounding electrode, and each inner electrode layer of the two inner electrode layers is connected to at least one signal electrode.

In the filter provided by the embodiments of the present invention, two inner electrode layers are disposed between two common electrode layers, which can integrate characteristics of a differential mode capacitor and a common mode capacitor. The filter features in small size and convenient fabrication, which can effectively reduce a fabrication cost of the filter. In addition, a formed differential mode capacitor has a large capacity, and has a good filtering effect during filtering processing on low frequency noise such as a direct current circuit.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show some embodiments of the present invention, and persons of ordinary skill in the art may still derive other drawings from these accompanying drawings without creative efforts.

DETAILED DESCRIPTION

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are a part rather than all of the embodiments of the present invention. All other embodiments obtained by persons of ordinary skill in the art based on the embodiments of the present invention without creative efforts shall fall within the protection scope of the present invention.

Figure 1A:
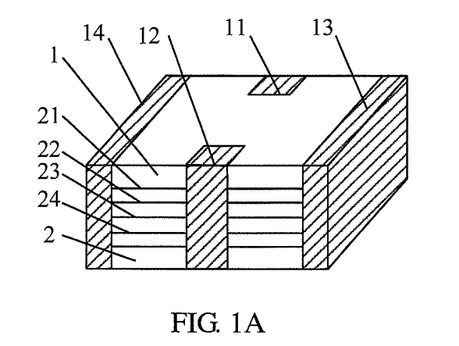
FIG. 1A is a schematic structural diagram of a filter according to a first embodiment of the present invention.
Figure 1B:
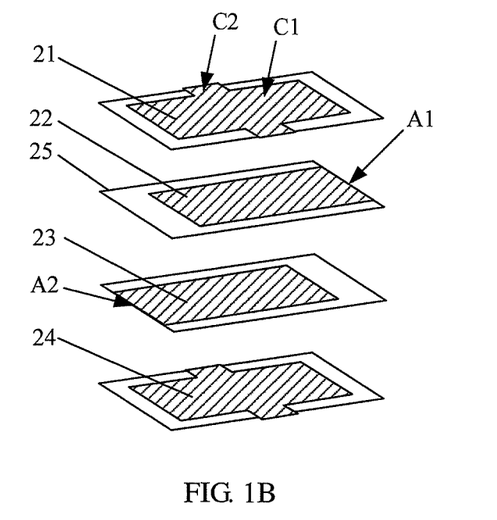
FIG. 1B is a schematic diagram of an assembly structure of each electrode layer in FIG. 1A.
Figure 1C:
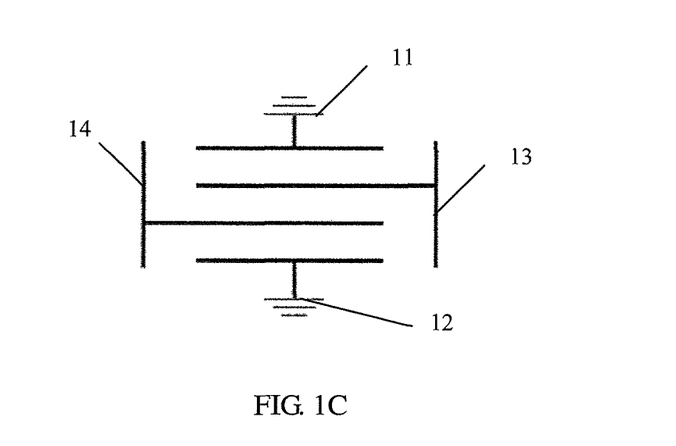
FIG. 1C is a schematic diagram of a structural principle of a filter according to an embodiment of the present invention.
Figure 1D:
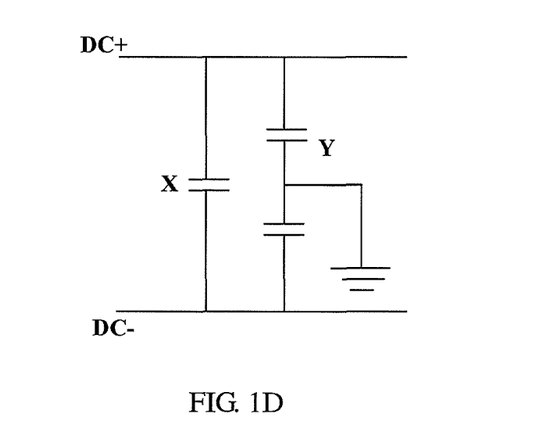
FIG. 1D is a schematic diagram of an equivalent circuit of the filter according to the first embodiment of the present invention.

FIG. 1A is a schematic structural diagram of a filter according to a first embodiment of the present invention; FIG. 1B is a schematic diagram of an assembly structure of each electrode layer in FIG. 1A; FIG. 1C is a schematic diagram of a structural principle of a filter according to an embodiment of the present invention; and FIG. 1D is a schematic diagram of an equivalent circuit of the filter according to the first embodiment of the present invention. The filter provided by this embodiment includes two common electrode layers and two inner electrode layers, where the two inner electrode layers are located between the two common electrode layers, and an electrical insulation layer is disposed between any two adjacent electrode layers of the two common electrode layers and the two inner electrode layers; each of the two common electrode layers is connected to at least one grounding electrode; and each of the two inner electrode layers is connected to at least one signal electrode. Specifically, as shown in FIG. 1A and FIG. 1B, the two common electrode layers are a first common electrode layer 21 and a second common electrode layer 24, and the two inner electrode layers are a first inner electrode layer 22 and a second inner electrode layer 23, where the first common electrode layer 21, the first inner electrode layer 22, the second inner electrode layer 23 and the second common electrode layer 24 are stacked successively, and an electrical insulation layer 25 is disposed between each two electrode layers.

In this embodiment, as shown in FIG. 1A to FIG. 1C, an outer surface of the filter is disposed with a first grounding electrode 11, a second grounding electrode 12, a first signal electrode 13, and a second signal electrode 14, where the first grounding electrode 11 and the second grounding electrode 12 are both electrically connected to the first common electrode layer 21 and the second common electrode layer 24, the first signal electrode 13 is electrically connected to the first inner electrode layer 22, and the second signal electrode 14 is electrically connected to the second inner electrode layer 23.

Persons skilled in the art can understand that, in an actual application, the foregoing four electrode layers may be disposed inside an insulation shell, or an insulation protection layer may be disposed on upper and lower surfaces of the four stacked electrode layers, so as to form a filter structure with external protection. Each grounding electrode and signal electrode is disposed on a surface of the filter, is electrically connected to the common electrode layers and the inner electrode layers, and is used to connect to another electronic component or circuit. As shown in FIG. 1A, in this embodiment, the upper and lower surfaces of the four electrode layers are respectively disposed with a first electrical insulation protection layer 1 and a second electrical insulation protection layer 2, and an outer surface of the filter formed of the six-layer structure is directly disposed with a signal electrode and a common grounding electrode.

Persons skilled in the art can understand that, the first grounding electrode 11 may be connected only to the first common electrode layer 21, the second grounding electrode 12 may be connected only to the second common electrode layer 24, or the first grounding electrode 11 and the second grounding electrode 12 may also be electrically connected to form a whole. In addition, each common electrode layer may be connected to two or more than two grounding electrodes. The number of disposed grounding electrodes of each common electrode layer and a connection manner of each common electrode layer may be set according to an actual requirement, which is not specially limited herein.

When the filter in this embodiment is used, as shown in FIG. 1C and FIG. 1D, the first signal electrode 13 and the second signal electrode 14 may be respectively connected to a direct current positive electrode DC+ and a direct current negative electrode DC− in a direct current power supply circuit, that is, the filter may be connected to the direct current circuit in parallel, and the first grounding electrode 11 and the second grounding electrode 12 are grounded. In this way, in the direct current power supply circuit, a differential mode capacitor characteristic is presented between the first inner electrode layer 22 and the second inner electrode layer 23 in the filter, which is equal to a differential mode capacitor in the circuit, that is, an X capacitor shown in FIG. 1D. Moreover, a common mode capacitor characteristic may be jointly presented between the first inner electrode layer 22 and the first common electrode layer 21, and between the second inner electrode layer 23 and the second common electrode layer 24, which is equal to a common mode capacitor in the circuit, that is, a Y capacitor shown in FIG. 1D. Therefore, the filter has a function of both differential mode filtering and common mode filtering, and may be considered as integration of a differential mode capacitor and a common mode capacitor.

When the filter in this embodiment is connected to a direct current power supply circuit in parallel, a path for noise such as clutter to return to ground may be effectively shortened, the number of capacitors attached to a discrete capacitor used by convention may be reduced, and a better filtering effect may be achieved. In addition, the filter in this embodiment has a smaller size when implementing a same filtering function.

In this embodiment, a distance between the first inner electrode layer 22 and the second inner electrode layer 23 is small, and a capacity of a differential mode capacitor formed by them is large, thereby achieving a good filtering effect of filtering processing on low-frequency noise such as that of a direct current power supply.

In this embodiment, each of the two inner electrode layers may be disposed with a dock connector electrically connected to a signal electrode, so as to input a current into the inner electrode layer or output a current from the inner electrode layer; and the dock connectors at the two inner electrode layers may be staggered from each other, so that current flow directions at the two inner electrode layers, namely, directions of input or output currents of the two inner electrode layers are different. Specifically, as shown in FIG. 1B, the first inner electrode layer 22 is disposed with a first dock connector A1, the second inner electrode layer 23 is disposed with a second dock connector A2, the first signal electrode 13 is electrically connected to the first dock connector A1, the second signal electrode 14 is electrically connected to the second dock connector A2, and the first dock connector A1 and the second dock connector A2 are disposed opposite to each other, that is, the first dock connector A1 and the second dock connector A2 are located at two opposite ends of the filter, and the first dock connector A1 and the second dock connector A2 are extended parts of the inner electrode layers, so that current flow directions of the first inner electrode layer 22 and the second inner electrode layer 23 are opposite. In this way, a magnetic field generated at each inner electrode layer can be mutually offset, thereby improving a filtering effect of the filter.

In this embodiment, as shown in FIG. 1B, the first common electrode layer 21 and the second common electrode layer 24 may both have a common main zone C1 and a common extended zone C2, where an area of the common extended zone C2 is smaller than an area of the common main zone C1, and the common main zone C1 may be electrically connected to the first grounding electrode 11 or the second grounding electrode 12 by using the common extended zone C2, so as to facilitate fabrication of the common electrode layer, and meanwhile avoid an occurrence of an electrical connection to another electrode layer, especially an occurrence of an electrical connection to a signal electrode. The common extended zone C2 may form a dock connector at the common electrode layers, and is used to connect to a grounding electrode.

In this embodiment, the foregoing common main zones of the two common electrode layers may have a same shape, which may be specifically a rectangular shape. In addition, the common extended zones at the two electrode layers overlap in a direction perpendicular to a plane where the common main zones are located. Specifically, the two common electrode layers may both be disposed with two extended zones, and as shown in FIG. 1B, two extended zones C2 are symmetrically disposed at a first common electrode layer 21 and a second common electrode layer 22, and the extended zones C2 at the two common electrode layers overlap, which facilitates disposition of grounding electrodes on the outer surface of the filter.

In this embodiment, as shown in FIG. 1B, the first inner electrode layer 22 and the second inner electrode layer 23 are disposed asymmetrical, that is, an area and a shape of the first inner electrode layer 22 and the second inner electrode layer 23 are the same. However, the first inner electrode layer 22 is disposed close to one end of the filter, so as to form the dock connector A1 at one end of the filter; the second inner electrode layer 23 is disposed close to the other end of the filter in the opposite, so as to form the dock connector A2 at the other end of the filter. In this way, signal electrodes fabricated externally can be directly and electrically connected to the inner electrode layers, which facilitates fabrication of the inner electrode layers and the signal electrodes.

In this embodiment, as shown in FIG. 1A, the entire filter is of a rectangular structure; two opposite end surfaces of the filter are separately disposed with a conductive layer to form the first signal electrode 13 and the second signal electrode 14 respectively at two ends of the filter. Persons skilled in the art can understand that, positions of the first signal electrode 13 and the second signal electrode 14 are not limited to the two ends in the opposite, and may also be other positions, as long as the two signal electrodes are not in direct contact.

In this embodiment, as shown in FIG. 1A, the first grounding electrode 11 and the second grounding electrode 12 are separately disposed on a side surface of the middle part of the filter, and the two grounding electrodes are not connected directly. In this way, a preferable safety distance may be kept between the signal electrodes disposed at the two opposite ends of the filter, so that the filter may have a good high-voltage withstand capability, and can meet a high-voltage safety requirement. Persons skilled in the art can understand that, the forgoing first grounding electrode 11 and second grounding electrode 12 may be an electrically-connected integrated structure, and a position of the first grounding electrode 11 and second grounding electrode 12 on the outer surface of the filter can be arranged flexibly according to an actual requirement.

In this embodiment, the foregoing first common electrode layer 21, the first inner electrode layer 22, the second inner electrode layer 23, and the second common electrode layer 24 are all disposed on a dielectric insulating substrate, each electrode layer is disposed by using a dielectric insulating substrate for electrical insulation, and the dielectric insulating substrate is the foregoing electrical insulation layer 25. Preferably, the dielectric insulating substrate in this embodiment is a ceramic wafer, and an insulation shell or insulation layer for protecting each electrode layer may also be a ceramic wafer.

In this embodiment, when the filter is fabricated, the first common electrode layer 21, the first inner electrode layer 22, the second inner electrode layer 23, and the second common electrode layer 24 may first be fabricated on the dielectric insulating substrate; then, the first common electrode layer 21, the first inner electrode layer 22, the second inner electrode layer 23, and the second common electrode layer 24 are stacked successively, and a first electrical insulation layer 1 and a second electrical insulation layer 2 are disposed on outer surfaces of the first common electrode layer 21 and the second common electrode layer 24 to obtain a ceramic body; and then, the first grounding electrode 11, the second grounding electrode 12, the first signal electrode 13, and the second signal electrode 14 are disposed on an outer surface of the ceramic body to form the filter.

In this embodiment, each of the foregoing electrode layers may adopt an electrode of a same material, or adopt an electrode of a different material, for example, may all adopt a nickel metal material or nickel alloy material; the grounding electrodes and the signal electrodes may also adopt electrodes of a same or different material, and the grounding electrodes and the signal electrodes may adopt a material same as or different from a material of each electrode layer.

In this embodiment, as shown in FIG. 1A, the filter may be fabricated by adopting a Surface Mount Technology process, so as to obtain a chip filter. The filter is small in size and occupies small space on a circuit board, and is convenient for assembly.

In this embodiment, the two inner electrode layers are disposed between the two common electrode layers to form a differential mode capacitor characteristic between the two inner electrode layers, and the two inner electrode layers may be designed to be very close, which can effectively improve a capacity of the formed differential mode capacitor. Meanwhile, each inner electrode layer corresponds to one common electrode layer, and in this way, each differential mode capacitor is in a semi-shielded state, which helps protect the inner electrode layers from outside noise interference. In addition, the two inner electrode layers separately form a common mode capacitor characteristic with an adjacent common mode electrode layer. Because an area of the common electrode layer may be equal to the area of the inner electrode layer, a contact surface is large, and a filtering effect is good.

In this embodiment, when the filter is used, it only needs to connect the filter to a circuit in parallel, so that a distance for noise to return to ground is shorter, and an equivalent series resistance (ESR) and equivalent series inductance (ESL) are lower; in addition, an X capacitor part is implemented by the two inner electrode layers, and may have a higher capacity, thereby having a good differential mode filtering effect. The filter is highly applicable to filtering processing on a direct current power supply, and can be applied to filtering for a frequency of 100 kHz to 100 MHz.

The filter in this embodiment adopts a stacked structure, is convenient in fabrication and low in cost; and integrates the traditional differential mode capacitor and common mode capacitor, is small in size, and therefore can reduce a size of a filtering circuit and has a good filtering effect.

To sum up, in the filter provided by the embodiment of the present invention, two inner electrode layers are disposed between two common electrode layers, and characteristics of a differential mode capacitor and a common mode capacitor are integrated. The filter features a small size and convenient fabrication, which can effectively reduce a fabrication cost. In addition, the formed differential mode capacitor has a relatively large capacity, and has a good filtering effect of filtering processing on low-frequency noise such as that of a direct current circuit.

Figure 2:
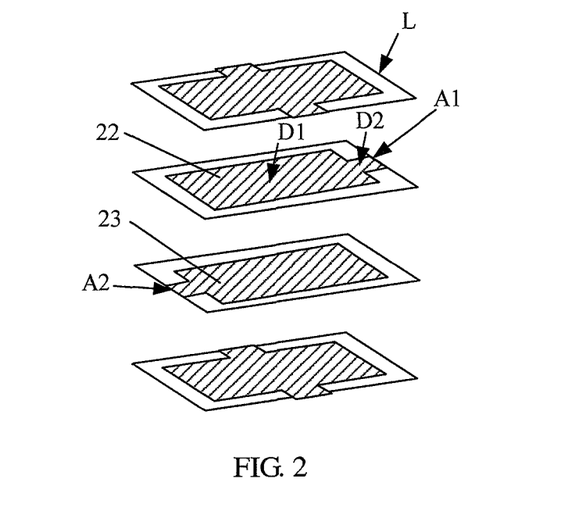
FIG. 2 is a schematic diagram of an assembly structure of each electrode layer according to a second embodiment of the present invention.

FIG. 2 is a schematic diagram of an assembly structure of each electrode layer according to a second embodiment of the present invention. Different from the technical solution shown in FIG. 1A to FIG. 1C, in this embodiment, two inner electrode layers both include a main zone and an extended zone that extends outwards along an edge of the main zone, where the extended zone forms a dock connector at an inner electrode layer, and extended zones at the two inner electrode layers do not overlap in a direction perpendicular to a plane where the inner electrode layers are located. Specifically, as shown in FIG. 2, a first inner electrode layer 22 and a second inner electrode layer 23 are both formed by a main zone D1 and an extended zone D2, and main zones D1 are rectangles of a same shape and area and disposed by overlapping. A dock connector for the first inner electrode layer 22 and the second inner electrode layer 23 to be electrically connected to a signal electrode is the extended zone D2, and the extended zones D2 of the first inner electrode layer 22 and the second inner electrode layer 23 are located at two opposite ends, that is, the extended zones D2 at the two inner electrode layers do not overlap in an up and down direction shown in FIG. 2.

Persons skilled in the art can understand that, the extended zones D2 at the foregoing two inner electrode layers may be disposed outside the middle part of the edges of the main zones, or may also be disposed at the corners of the main zones, as long as the two extended zones at the two inner electrode layers do not overlap in the up and down direction.

In this embodiment, an electrical connection is disposed between an extended zone and a signal electrode, and two inner electrode layers overlap with main zones of common electrode layers, so that a filter may have better capacitor characteristics, which improves a filtering effect of the filter; in addition, the extended zone is disposed as a dock connector of each electrode layer, so that there is a transition for an electrical connection between the main zone of each electrode layer and an external electrode, and processing and fabrication of the filter are more convenient.

Figure 3:
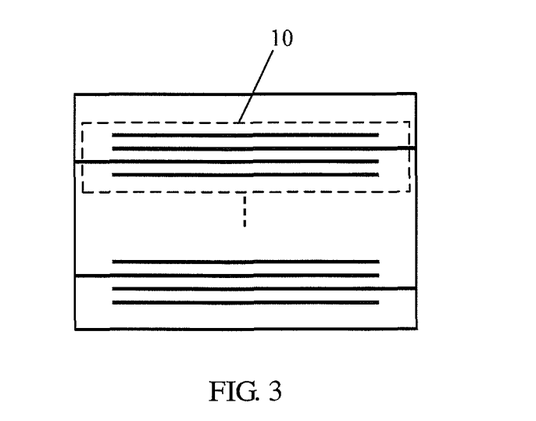
FIG. 3 is a schematic diagram of a structural principle of a filter according to a third embodiment of the present invention.

FIG. 3 is a schematic diagram of a principle structure of a filter according to a third embodiment of the present invention. Different from the technical solution shown in FIG. 1A to FIG. 1C, in this embodiment, the filter includes multiple filtering units 10, where each filtering unit 10 includes a first common electrode layer, a first inner electrode layer, a second inner electrode layer, and a second common electrode layer that are stacked as shown in FIG. 1B, and the multiple filtering units 10 are stacked and disposed between a first electrical insulation layer and a second electrical insulation layer.

In this embodiment, in each filtering unit 10, the first common electrode layer is electrically connected to a first grounding electrode, the first inner electrode layer is electrically connected to a first signal electrode, the second inner electrode layer is electrically connected to a second signal electrode, and the second common electrode layer is electrically connected to a second grounding electrode, so that a manner that multiple filtering units are connected in parallel is formed in a circuit.

Persons skilled in the art can understand that, in an actual application, according to a filtering requirement, an appropriate number of filtering units may be disposed in the filter to meet an actual filtering requirement.

Figure 4A:
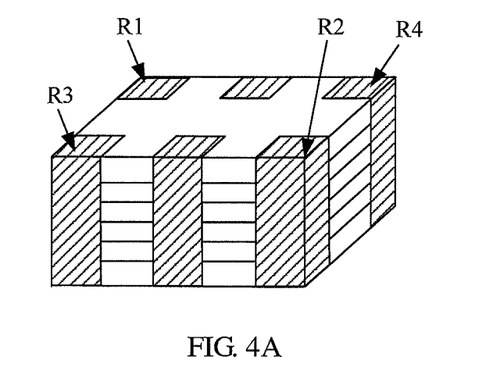
FIG. 4A is a schematic structural diagram of a filter according to a fourth embodiment of the present invention.
Figure 4B:
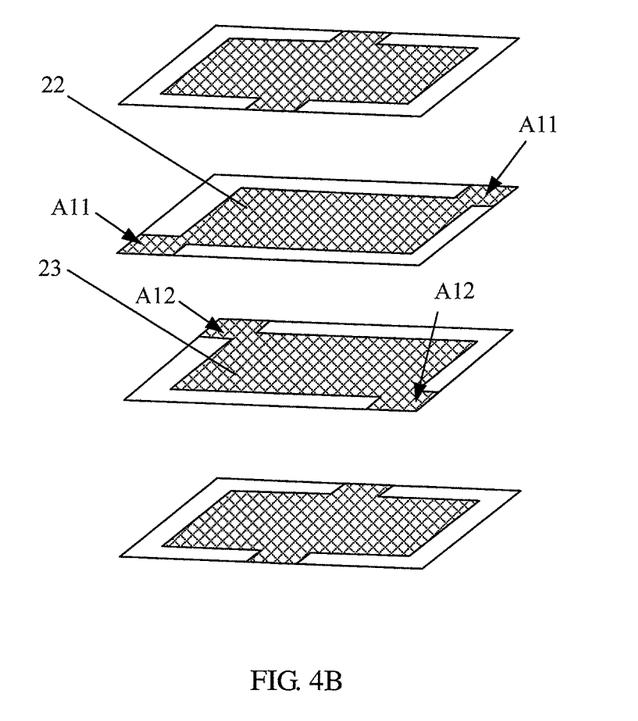
FIG. 4B is a schematic diagram of an assembly structure of each electrode layer in FIG. 4A.

FIG. 4A is a schematic structural diagram of a filter according to a fourth embodiment of the present invention; and FIG. 4B is a schematic diagram of an assembly structure of each electrode layer in FIG. 4A. Different from the technical solution shown in FIG. 1A to FIG. 1C, in this embodiment, each inner electrode layer may be disposed with two dock connectors, where each of two opposite corners at one inner electrode layer of the two inner electrode layers is disposed with a dock connector; and each of another two opposite corners that are at the other inner electrode layer of the two inner electrode layers and staggered from the two opposite corners at the one inner electrode layer is disposed with a dock connector. Specifically, as shown in FIG. 4A and FIG. 4B, a first inner electrode layer 22 is disposed with two dock connectors A11 along a first diagonal line; and accordingly, a second inner electrode layer 23 is disposed with two dock connectors A12 along a second diagonal line crossed with the first diagonal line.

In this embodiment, as shown in FIG. 4A and FIG. 4B, outer surfaces of the filter may be disposed with four signal electrodes R1, R2, R3 and R4, the signal electrode R1 is connected to the dock connector A11 in a corresponding position of the first inner electrode layer 22, the signal electrode R2 is connected to the other dock connector A11. Similarly, the signal electrodes R3 and R4 are respectively connected to the two dock connectors A12 at the second inner electrode layer 23, so that the filter can form a six-terminal structure, and can meet an application scenario of a six-terminal filter circuit, for example, can perform filtering processing on two different voltage signals.

In this embodiment, the two dock connectors A11 and the two dock connectors A12 are disposed diagonally, therefore, current flow directions of the first inner electrode layer 22 and the second inner electrode layer 23 are crossed, thereby reducing common mode impedance, and improving a filtering effect.

Persons skilled in the art can understand that, in an actual application, the dock connectors at the two inner electrode layers may be formed by extended zones. Specifically, the two inner electrode layers both include a main zone and two extended zones that extend outwards along edges of the main zone, and each extended zone forms a dock connector at the inner electrode layers; and the extended zones at the two inner electrode layers do not overlap in a direction perpendicular to a plane where the inner electrode layers are located, where the main zones of the two inner electrode layers are both rectangles, and the two extended zones at each inner electrode layer are disposed at the two opposite corners of the main zone symmetrically to a center of the main zone (as shown in FIG. 4B). In addition, the two extended zones may also be disposed on two opposite sides symmetrically to the center of the main zone, which is not particularly limited by the embodiment of the present invention.

Persons skilled in the art can understand that, in the technical solution shown in FIG. 4A, multiple filtering units may also be disposed between a first insulation layer and a second insulation layer, and the filtering units may specifically have the structure shown in FIG. 4B, and specific implementation of the filtering units is similar to the embodiment shown in FIG. 3, and details are not repeatedly described herein.

Figure 5:
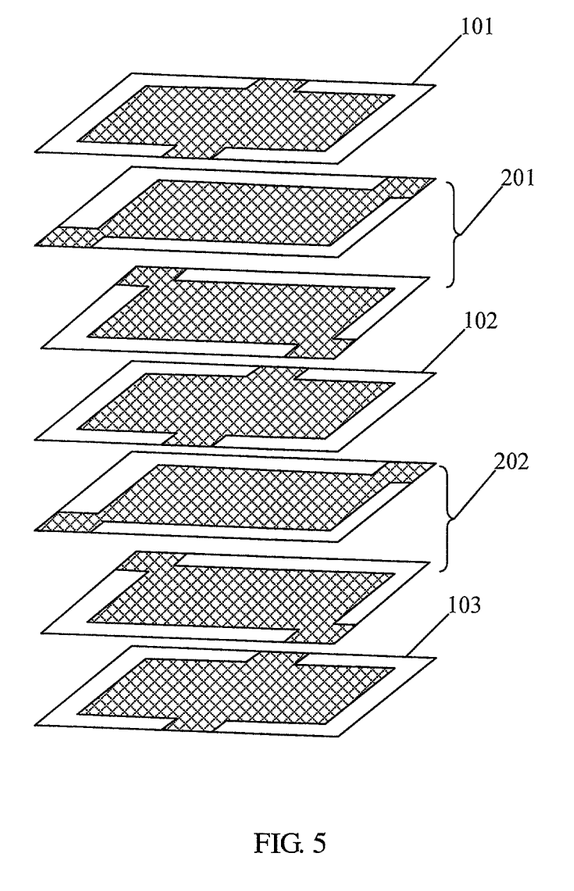
FIG. 5 is a schematic diagram of an assembly structure of each electrode layer in a filter according to a fifth embodiment of the present invention.

FIG. 5 is a schematic diagram of an assembly structure of each electrode layer in a filter according to a fifth embodiment of the present invention. Different from the technical solution shown in FIG. 1A to FIG. 1C, in this embodiment, the filter includes three common electrode layers and two pairs of inner electrode layers, where each pair of inner electrode layers includes two inner electrode layers, and the three common electrode layers include a first common electrode layer, a second common electrode layer and a third common electrode layer, where one pair of inner electrode layers is located between the first common electrode layer and the second common electrode layer, the other pair of inner electrode layers is located between the second common electrode layer and the third common electrode layer, and an electrical insulation layer is disposed between each two electrode layers. In addition, each of the three common electrode layers is further connected to at least one grounding electrode, and each inner electrode layer of the two inner electrode layers is further connected to at least one signal electrode. Specifically, as shown in FIG. 5, in this embodiment, the three common electrode layers are a first common electrode layer 101, a second common electrode layer 102, and a third common electrode layer 103. In the two pairs of inner electrode layers, each pair of inner electrode layers includes two inner electrode layers, where one pair of inner electrode layers 201 is located between the first common electrode layer 101 and the second common electrode layer 102, the other pair of inner electrode layers 202 is located between the second common electrode layer 102 and the third common electrode layer 103, and an electrical insulation layer is disposed between each two electrode layers.

In this embodiment, in the two pairs of inner electrode layers, each of the two inner electrode layers in each pair of inner electrode layers is disposed with a dock connector that is electrically connected to a signal electrode and used for inputting or outputting a current. In an actual application, the dock connectors at the two inner electrode layers of each pair of inner electrode layers are staggered from each other, so that current flow directions of the two inner electrode layers in each pair of inner electrode layers are different.

In this embodiment, the two inner electrode layers in each pair of inner electrode layers that is disposed between two common electrode layers may have a structure same as or similar to that shown in FIG. 1A to FIG. 1C, or in FIG. 4A and FIG. 4B, and the common electrode layers may also have a structure same as or similar to that shown in FIG. 1A to FIG. 1C, or in FIG. 4A and FIG. 4B, and details are not repeatedly described in the embodiment of the present invention.

Persons skilled in the art can understand that, in this embodiment, an outer surface of a filter may be disposed with one or more grounding electrodes used for electrically connecting to each common electrode in the filter; and meanwhile at least four signal electrodes may be disposed and used for electrically connecting to each inner electrode layer in the filter. For the number and positions of disposed grounding electrodes and signal electrodes, reference may be made to the filter shown in FIG. 1A to FIG. 1C, or in FIG. 4A and FIG. 5B, and details are not repeatedly described herein.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A filter, comprising:
   two common electrode layers and two inner electrode layers, wherein the two inner electrode layers are located between the two common electrode layers, and an electrical insulation layer is disposed between any two adjacent electrode layers of the two common electrode layers and the two inner electrode layers;
   wherein each of the two common electrode layers is connected to at least one grounding electrode;
   wherein each of the two inner electrode layers is connected to at least one signal electrode, and
   wherein each of the two inner electrode layers comprises: a main zone and two extended zones that extend outwards along an edge of the main zone, the two extended zones are disposed on two opposite sides or at two opposite corners of the main zone and are symmetric to a center of the main zone; and
   wherein the two extended zones of one of the two inner electrode layers do not overlap the two extended zones of the other of the two inner electrode layers in a direction perpendicular to a plane where the two inner electrode layers are located.

2. The filter according to claim 1, wherein each of the two inner electrode layers is electrically connected to the respective at least one signal electrode by a corresponding dock connector used for inputting or outputting a current.

3. The filter according to claim 2, wherein the respective dock connectors of the two inner electrode layers are staggered from each other, and a respective current direction of the two inner electrode layers is different from each other.

4. The filter according to claim 1, wherein:
   each of the two opposite corners at one inner electrode layer of the two inner electrode layers is disposed with a dock connector; and
   each of the two opposite corners that are at the other inner electrode layer of the two inner electrode layers is disposed with a dock connector.

5. The filter according to claim 1, wherein each extended zone forms a dock connector for the respective inner electrode layer.

6. The filter according to claim 5, wherein the main zones of the two inner electrode layers are rectangles.

7. The filter according to claim 1, wherein the two common electrode layers each comprise a common main zone and a common extended zone that extends outward along an edge of the respective common main zone, and each common extended zone forms a dock connector that is at the respective common electrode layer and electrically connected to the at least one grounding electrode.

8. The filter according to claim 7, wherein the common extended zones of the two common electrode layers overlap in a direction perpendicular to a plane where the common main zones are located.

9. The filter according to claim 7, wherein the common main zones of the two common electrode layers are rectangles, and each of the two common electrode layers is disposed with two common extended zones.

10. A filter, comprising:
three common electrode layers and two pairs of inner electrode layers, wherein each pair of inner electrode layers comprises two inner electrode layers;
wherein the three common electrode layers comprise a first common electrode layer, a second common electrode layer, and a third common electrode layer, wherein a first pair of the two pairs of inner electrode layers is located between the first common electrode layer and the second common electrode layer, a second pair of the two pairs of inner electrode layers is located between the second common electrode layer and the third common electrode layer, and an electrical insulation layer is disposed between each two adjacent electrode layers of the three common electrode layers and the two pairs of inner electrode layers;
wherein each of the three common electrode layers is connected to at least one grounding electrode, and each inner electrode layer of the two pairs of inner electrode layers is connected to at least one signal electrode;
wherein each of the two inner electrode layers of the first pair of inner electrode layers comprises: a the main zone, the two extended zones two extended zones that extend outwards along an edge of the main zone, the two extended zones are disposed on two opposite sides or at two opposite corners of the main zone and are symmetric to a center of the main zone; and
wherein the two extended zones of one of the two inner electrode layers of the first pair do not overlap the two extended zones of the other of the two inner electrode layers of the first pair in a direction perpendicular to a plane where the two inner electrode layers are located.

11. The filter according to claim 10, wherein, each of the two inner electrode layers in the first pair of inner electrode layers is disposed with a dock connector that is electrically connected to a signal electrode and used for inputting or outputting a current.

12. The filter according to claim 11, wherein the dock connectors of the two inner electrode layers of the first pair of inner electrode layers are staggered from each other, and a respective current direction of the two inner electrode layers of the first pair of inner electrode layers is different from each other.

* * * * *